US006660596B2

(12) United States Patent
Adkisson et al.

(10) Patent No.: US 6,660,596 B2
(45) Date of Patent: Dec. 9, 2003

(54) DOUBLE PLANAR GATED SOI MOSFET STRUCTURE

(75) Inventors: James W. Adkisson, Jericho, VT (US); John A. Bracchitta, South Burlington, VT (US); John J. Ellis-Monaghan, Grand Isle, VT (US); Jerome B. Lasky, Essex Junction, VT (US); Effendi Leobandung, Wappingers Falls, NY (US); Kirk D. Peterson, Essex Junction, VT (US); Jed H. Rankin, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/064,318

(22) Filed: Jul. 2, 2002

(65) Prior Publication Data

US 2002/0153587 A1 Oct. 24, 2002

Related U.S. Application Data

(62) Division of application No. 09/526,857, filed on Mar. 16, 2000.

(51) Int. Cl.[7] .............................................. H01L 21/336
(52) U.S. Cl. ........................ 438/286; 438/303; 438/304
(58) Field of Search ................................. 438/150, 151, 438/299, 183, 238, 131, 132, 152, 270, 273, 281, 288, 286, 303, 304; 257/347, 316, 344, 529

(56) References Cited

U.S. PATENT DOCUMENTS

| | | | | |
|---|---|---|---|---|
| 4,996,574 A | * | 2/1991 | Shirasaki | 257/66 |
| 5,273,921 A | | 12/1993 | Neudeck et al. | |
| 5,308,999 A | | 5/1994 | Gotou | |
| 5,316,957 A | * | 5/1994 | Spratt et al. | 438/311 |
| 5,336,625 A | * | 8/1994 | Tong | 148/DIG. 10 |
| 5,422,289 A | * | 6/1995 | Pierce | 438/297 |
| 5,447,875 A | * | 9/1995 | Moslehi | 438/303 |
| 5,580,802 A | | 12/1996 | Mayer et al. | |
| 5,689,127 A | | 11/1997 | Chu et al. | |
| 5,757,038 A | * | 5/1998 | Tiwari et al. | 257/192 |
| 5,773,331 A | * | 6/1998 | Solomon et al. | 438/164 |
| 5,780,327 A | * | 7/1998 | Chu et al. | 438/156 |
| 6,091,102 A | * | 7/2000 | Sekariapuram et al. | 257/316 |
| 6,096,580 A | * | 8/2000 | Iyer et al. | 438/131 |
| 6,100,172 A | * | 8/2000 | Furukawa et al. | 438/238 |
| 6,171,937 B1 | * | 1/2001 | Lustig | 438/585 |
| 6,180,469 B1 | * | 1/2001 | Pramanick et al. | 438/299 |
| 6,242,783 B1 | * | 6/2001 | Ohmi et al. | 257/401 |
| 6,291,278 B1 | * | 9/2001 | Xiang et al. | 438/183 |
| 6,307,237 B1 | * | 10/2001 | Erstad | 257/401 |
| 6,316,318 B1 | * | 11/2001 | Kapoor | 438/299 |
| 6,369,429 B1 | * | 4/2002 | Pramanick et al. | 257/382 |
| 6,380,589 B1 | * | 4/2002 | Krivokapic | 257/347 |
| 6,441,433 B1 | * | 8/2002 | En et al. | 257/344 |
| 6,458,662 B1 | * | 10/2002 | Yu | 438/286 |
| 6,483,156 B1 | * | 11/2002 | Adkisson et al. | 257/401 |

* cited by examiner

Primary Examiner—Carl Whitehead, Jr.
Assistant Examiner—Laura M Schillinger
(74) Attorney, Agent, or Firm—Whitham, Curtis & Christofferson, P.C.; William D. Sabo

(57) ABSTRACT

A double gated silicon-on-insulator (SOI) MOSFET is fabricated by using a mandrel shallow trench isolation formation process, followed by a damascene gate. The double gated MOSFET features narrow diffusion lines defined sublithographically or lithographically and shrunk, damascene process defined by an STI-like mandrel process. The double gated SOI MOSFET increases current drive per layout width and provides low out conductance.

9 Claims, 19 Drawing Sheets

DOUBLE PLANAR GATED SOI MOSFET STRUCTURE

BACKGROUND OF THE INVENTION

1. Field of the Invention

The present invention generally relates to double-gated Silicon-on-Insulator (SOI) Metal Oxide Semiconductor Field Effect Transistors (MOSFETS) that provide increased current drive per layout width and low output conductance.

2. Background Description

Field Effect Transistor (FET) structures may include a single gate (a single channel) or a pair of gates (a pair of channels), with double-gate versions providing the advantage of having an increased current carrying capacity. A number of horizontal double-gate FET structures, and particularly SOI double-gate FET structures, have been proposed. These structures typically require a bottom gate formed beneath the thin silicon body in addition to a conventional top gate. The fabrication of such structures is difficult because the top and bottom gates must be aligned to a tolerance beyond the accuracy of state of the art lithographical equipment and methods, and because self-aligning techniques are frustrated by the layers between the top and bottom gates.

In "Self-Aligned (Top and Bottom) Double-Gate MOSFET With a 25 nm Thick Silicon Channel", by Hon Sum Philip et al., IEDM 97-427, IEEE 1997, a double-gated MOSFET is considered the most promising candidate for a Complementary Metal Oxide Semiconductor (CMOS) scaled to the ultimate limit of 20–30 nm gate length. Rigorous Monte Carlo device simulations and analytical calculations predicted continual improvement in device performance down to 20–30 nm gate length, provided the silicon channel thickness can be reduced to 10–25 nm and the gate oxide thickness is reduced to 2–3 nm. However, the alignment of the top and the bottom is crucial to high performance because a mis-alignment will cause extra gate to source/drain overlap capacitance as well as loss of current drive.

In the double-gated MOSFET field, vertical structures such as the surrounding gate or pillar transistor and DELTA device require a lithographic and pattern transfer capability at least four times more stringent than the minimum gate length in order to control the required silicon channel thickness. On the other hand, the planar structures, which have been the norm of the Integrated Circuit (IC) industry to date are easier to manufacture than vertical structures. However, the double-gate MOSFET with a planar structure either does not have perfectly aligned gates, or did not have a source/drain fan-out structure that is self-aligned to the gates.

The following patents pertain to FETs, and particularly to the double-gated FETs.

U.S. Pat. No. 5,780,327, by Chu et al. and entitled "Vertical Double-Gate Field Effect Transistor" describes a vertical double-gate field effect transistor, which includes an epitaxial channel layer and a drain layer arranged in a stack on a bulk or SOI substrate. The gate oxide is thermally grown on the sides of the stack using differential oxidation rates to minimize input capacitance problems. The gate wraps around one end of the stack, while contacts are formed on a second end. An etch-stop layer embedded in the second end of the stack enables contact to be made directly to the channel layer.

U.S. Pat. No. 5,773,331 by Solomon et al. and entitled "Method for Making Single and Double Gate Field Effect Transistors With Sidewall Source-Drain Contacts" describes a method for making single-gate and double-gate field effect transistors having a sidewall drain contact. The channel of the FETs is raised with respect to the support structure underneath and the source and drain regions form an integral part of the channel.

U.S. Pat. No. 5,757,038 by Tiwari et al. and entitled "Self-Aligned Dual Gate MOSFET with an Ultranarrow Channel" is directed to a self-aligned dual gate FET with an ultra thin channel of substantially uniform width formed by a self-aligned process. Selective etching or controlled oxidation is utilized between different materials to form a vertical channel extending between source and drain regions, having a thickness in the range from 2.5 nm to 100 nm.

U.S. Pat. No. 5,580,802 to Mayer et. al. and entitled "Silicon-on-Insulator Gate-All-Around MOSFET Fabrication Methods" describes an SOI gate-all-around (GAA) MOSFET which includes a source, channel and drain surrounded by a top gate, the latter of which also has application for other buried structures and is formed on a bottom gate dielectric which is formed on source, channel and drain semiconductor layers of an SOI wafer.

U.S. Pat. No. 5,308,999 to Gotou and entitled "MOS FET Having a Thin Film SOI Structure" describes a MOS FET having a thin film 501 structure in which the breakdown voltage of an MIS (Metal Insulator Semiconductor) FET having an SOI structure is improved by forming the gate electrode on the top surface and two side surfaces of a channel region of the SOI layer and by partially extending the gate electrode toward the inside under the bottom of the channel region such that the gate electrode is not completely connected.

U.S. Pat. No. 5,689,127 to Chu et al. and entitled "Vertical Double-Gate Field Effect Transistor" describes a vertical double-gate FET that includes a source layer, an epitaxial channel layer and a drain layer arranged in a stack on a bulk or SOI substrate. The gate oxide is thermally grown on the sides of the stack using differential oxidation rates to minimize input capacitance problems. The gate wraps around one end of the stack, while contacts are formed on a second end. An etch-stop layer embedded in the second end of the stack enables contact to be made directly to the channel layer.

The key difficulties in fabricating double-gated FETs are achieving silicidation of thin diffusions or polysilicon with acceptable contact resistance, enabling fabrication of the wraparound gate without misalignment of the two gates, and fabrication of the narrow diffusions (ideally, 2–4 times smaller than the gate length).

The lithographically defined gate is by far the simplest, but suffers from a number of disadvantages. First, definition of the gate may leave poly spacers on the side of the diffusions or may drive a required slope on the side of the diffusion, thereby resulting in a poorer quality and/or more poorly controlled device. Second, the slope of the poly inherently leads to difficulty in forming silicided gates, leading to slower device performance. Finally, the poly step height poses a difficult problem for lithographic definition, as we expect steps on the order of 100 nm–200 nm in a 50 nm design rule technology.

BRIEF SUMMARY OF THE INVENTION

It is therefore an object of the present invention to provide a self-aligned dual-gated SOI MOSFET.

BRIEF DESCRIPTION OF THE SEVERAL VIEWS OF THE DRAWING

The foregoing and other objects, aspects and advantages will be better understood from the following detailed description of a preferred embodiment of the invention with reference to the drawings, in which:

FIG. 9 cut D—D shows a partial representational perspective of one of the silicon lines shown in FIG. 3B;

FIG. 10 cut F—F shows a partial representational cut of one of the silicon lines shown in FIG. 4B;

FIG. 11A cut H—H shows a partial representational cut of one of the silicon lines shown in FIG. 5B;

FIG. 11B cut J—J shows a representational embodiment of FIG. 6B cut B—B;

DETAILED DESCRIPTION OF THE INVENTION

Figure 1:
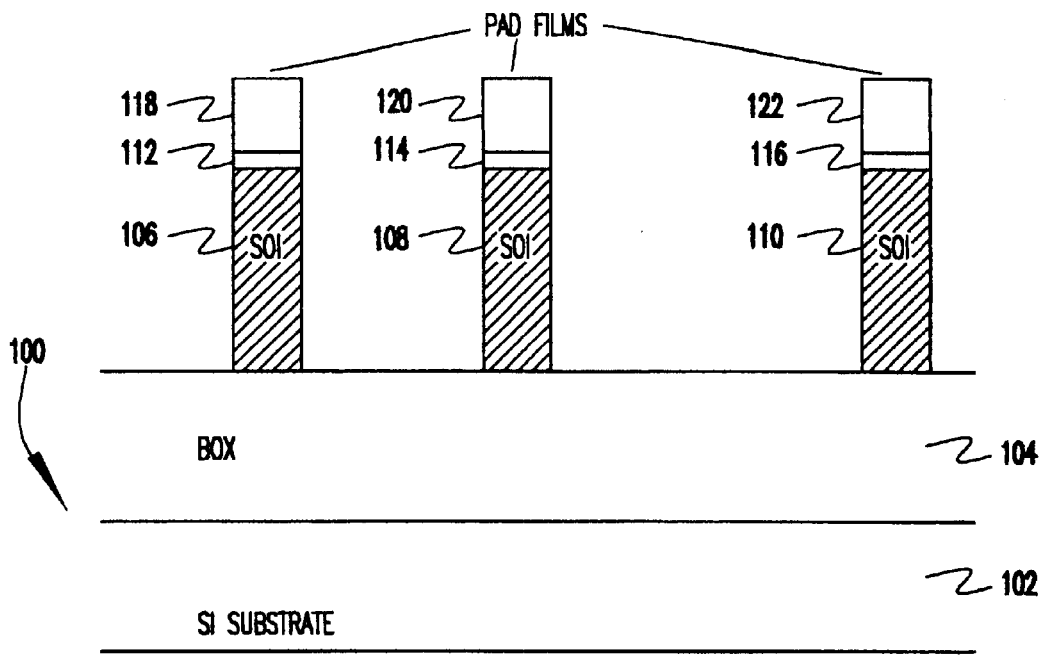
FIG. 1 is a representational cross section of cut A—A shown in FIG. 6b, showing the formation of silicon lines.
Figure 7:
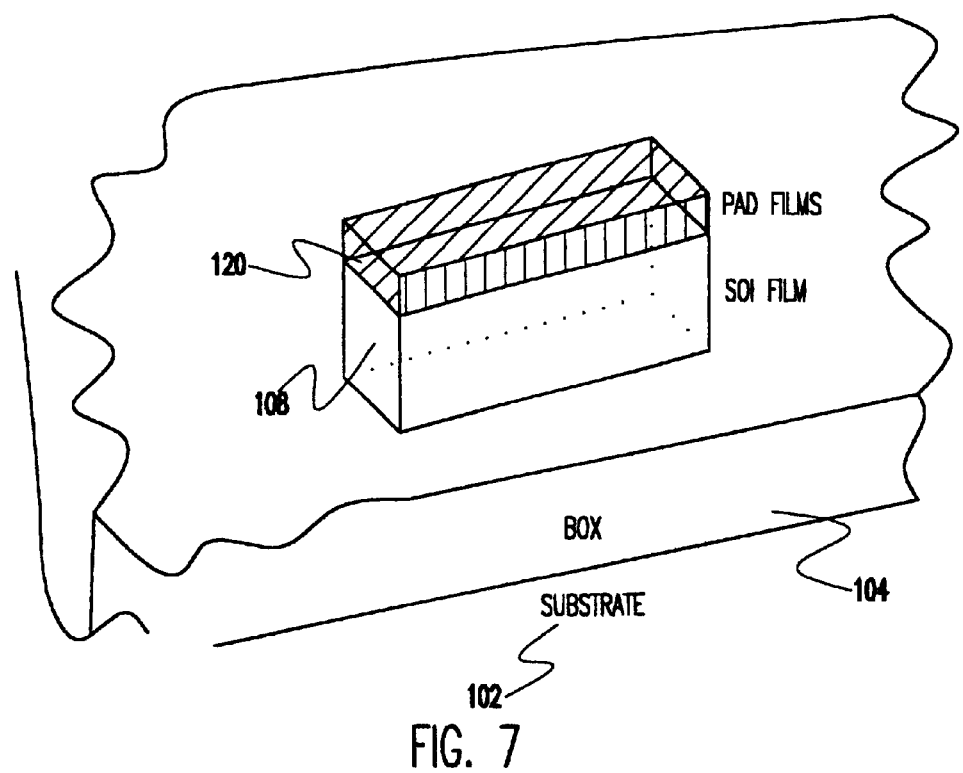
FIG. 7 shows a perspective view of one of the SOI lines shown in FIG. 1.

Referring now to FIG. 1, there is shown a patterned SOI substrate 100 having a bulk substrate 102, a buried oxide (BOX) layer 104, and narrow silicon lines 106, 108 and 110. In a preferred embodiment, the width of the silicon lines 106, 108 and 110 is approximately 5 to 50 nanometers (nm), which is typically one fourth of the device length. Pad oxide 112, 114 and 116 is grown using standard oxidation techniques and would typically be in the range of 3 to 14 nm, with 8 nm being preferred. Pad films 118, 120 and 122 are placed upon pad, oxide 112, 114, and 116, respectively. Pad films 118, 120 and 122 are typically in the range of 30 to 120 nm, with 80 nm being preferred. It is preferred that nitride films be utilized, although other materials may also be used. Pad films 118, 120 and 122 define the etch areas for shallow trench isolation (STI) formation. In a preferred embodiment, thin diffusions in the range of 5 to 50 nm, with 10 nm preferred, can be formed above the thin silicon regions 108 that can be formed above BOX layer 104 using lithographic techniques and subtractive etching, and techniques such as sidewall image transfer, hybrid resist, thinning techniques using isotropic etching, or oxidation/removal steps to generate the narrow images. FIG. 7 shows a partial perspective view of silicon line 108 shown in FIG. 1, where silicon line 108 is formed on BOX layer 104.

Figure 2:
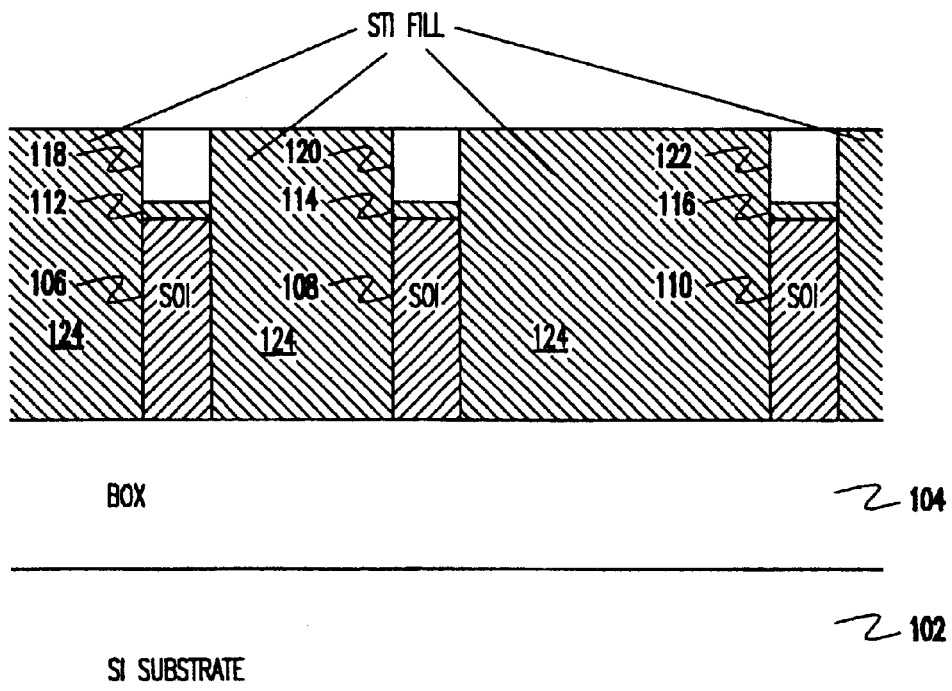
FIG. 2 shows the substrate of FIG. 1 after shallow trench isolation (STI) fill and polish.
Figure 8:
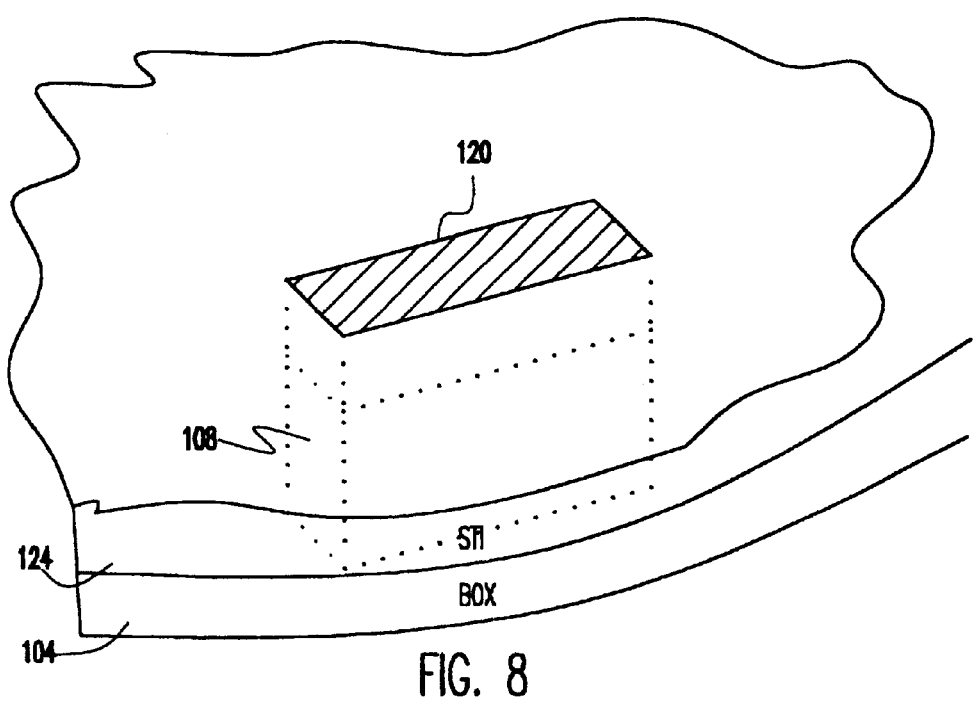
FIG. 8 shows a perspective view of one of the SOI lines shown in FIG. 2.

Then, in FIG. 2, a standard STI fill 124 is provided, which is preferably a silicon dioxide layer of approximately 300 to 500 nm thick. However, other suitable materials known to those skilled in the art may also be used as a sacrificial film. It is preferred that the STI surface be polished. FIG. 8 is a perspective view of silicon line 108 shown in FIG. 2, where STI 124 is filled around the silicon line 108.

Figure 3A:
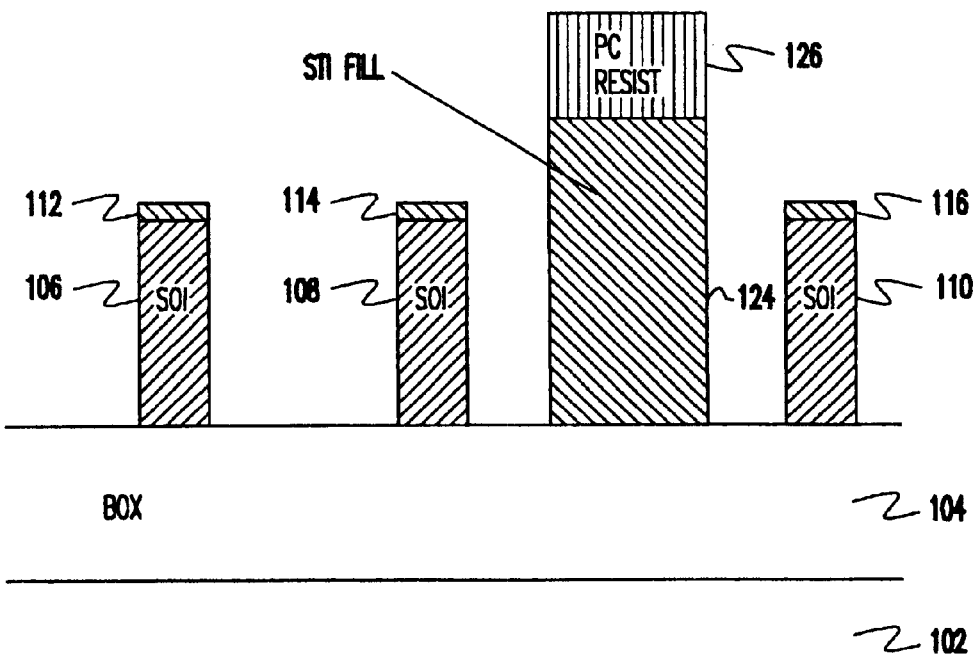
FIG. 3A is a representational cross section of cut A—A shown in FIG. 6B, after a polysilicon conductor (PC) resist mask is applied and etching.
Figure 4A:
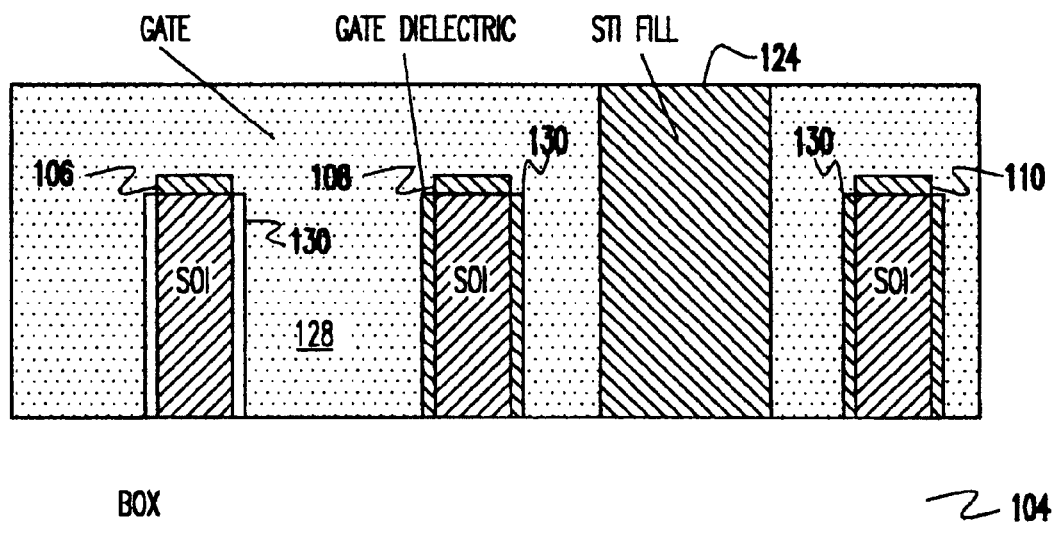
FIG. 4A shows the substrate of FIG. 3A after gate dielectric growth or deposition, and gate conductor deposition.
Figure 5A:
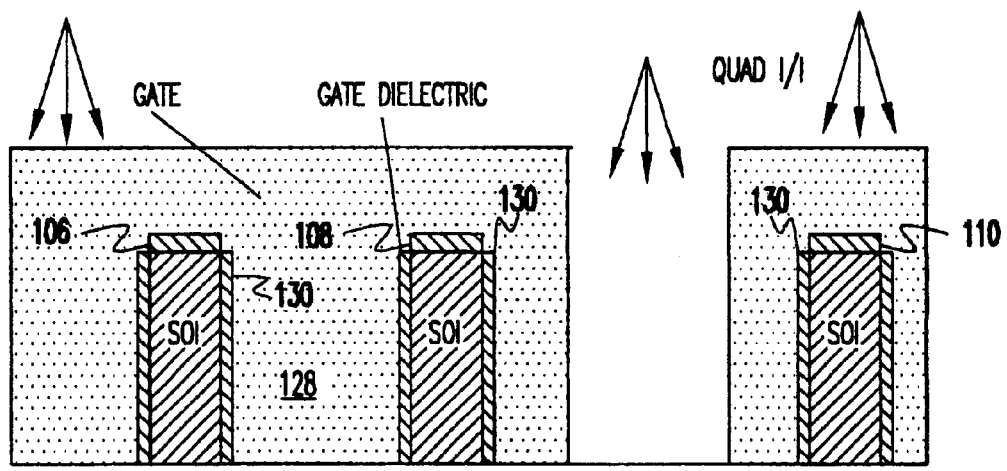
FIG. 5A shows removal of STI and isolation implants in the substrate of FIG. 4A.
Figure 6A:
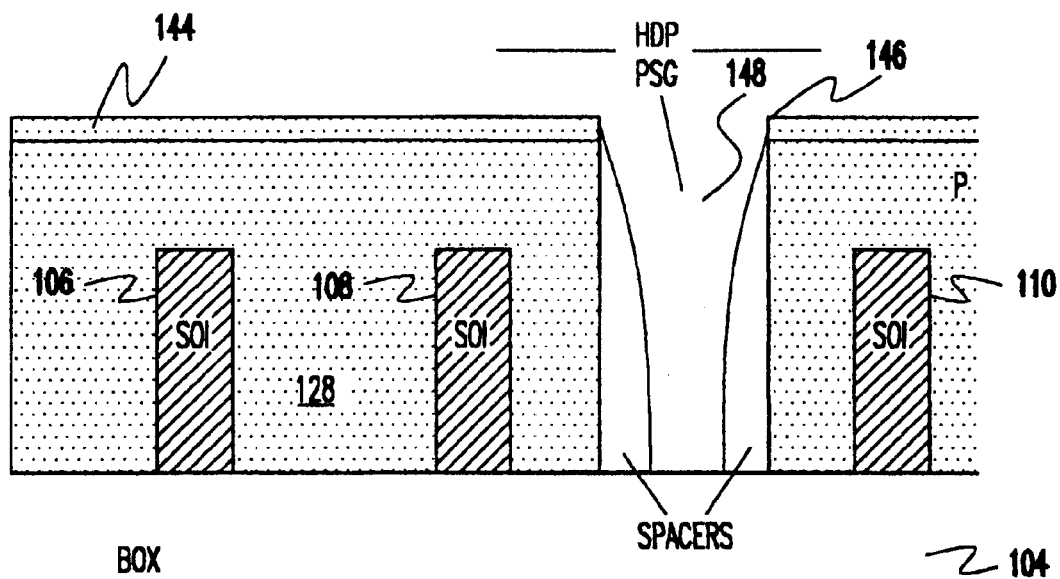
FIG. 6A shows the completed device of FIG. 5A before contacts.
Figure 6B:
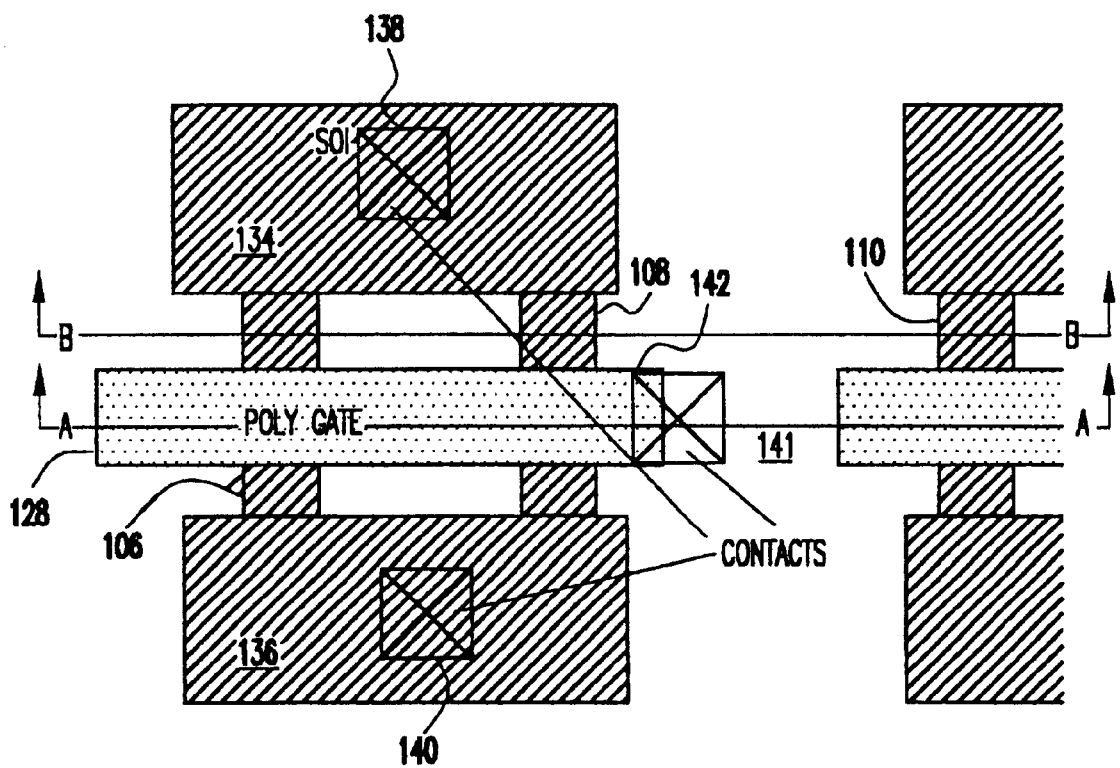
FIG. 6B shows a top view of the completed device.
Figure 9:
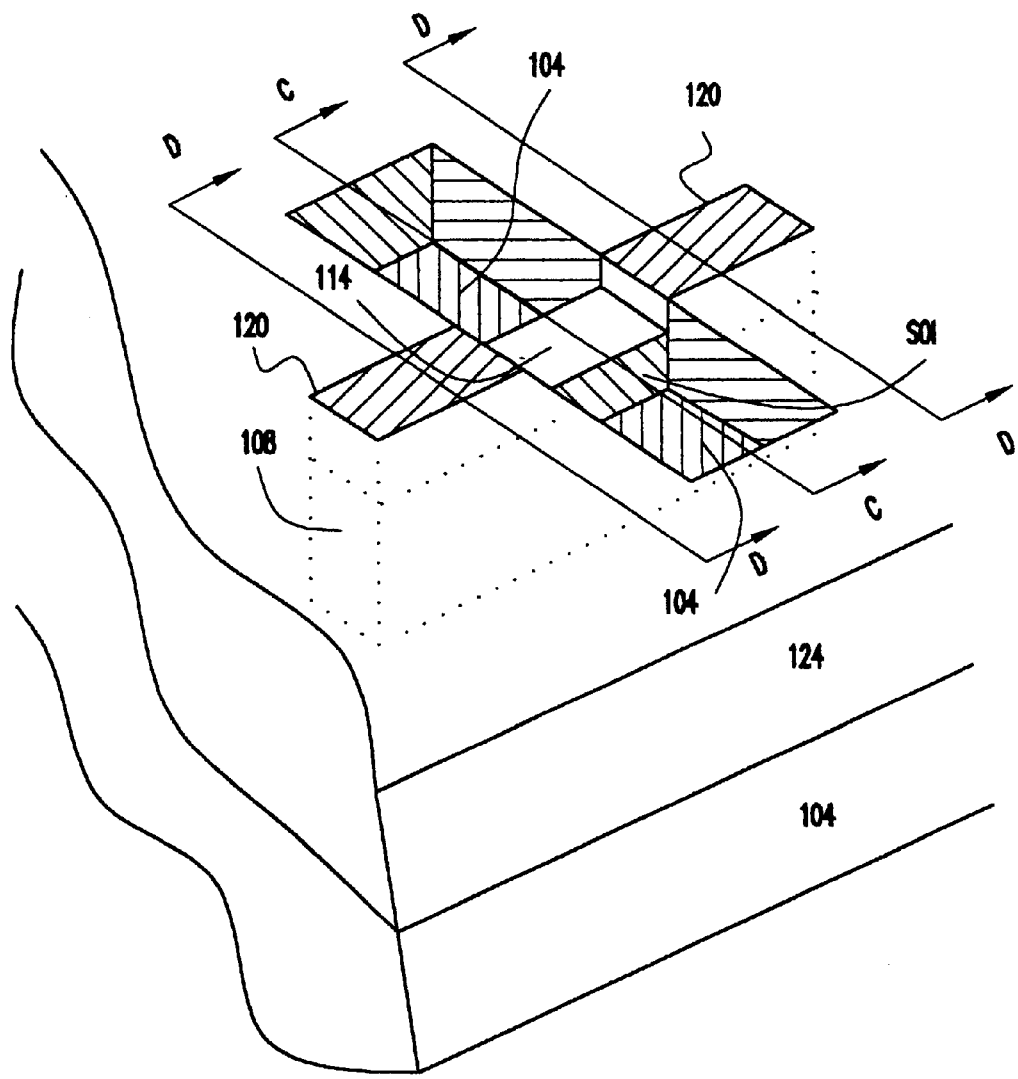
FIG. 9 cut C—C shows a representational perspective of one of the silicon lines shown in FIG. 3A.

FIG. 3A is a representational cross-sectional cut along line A—A of FIG. 6B. FIG. 3A is representational because polysilicon conductor (PC) resist 126 and STI fill 124 are present during fabrication in FIG. 3A, but are not present in corresponding region 141 of FIG. 6B. After placing the PC resist mask 126 on a selected regions of STI fill 124, STI fill 124 is selectively etched relative to pad films 118, 120 and 122 and down to the BOX layer 104. It is preferred, but not required, that the etch also be selective relative to the BOX layer 104. Pad films 118, 120 and 122 are then removed selectively to the STI fill layer 124 and BOX layer 104. The FIGS. 3A, 4A and 5A show that some of the pad layers 118, 120, 122 could be left, if desired, to allow a thin gate dielectric only on the sidewalls of the silicon lines 106, 108 and 110, respectively. It is preferred that there be approximately a 10:1 selectivity in each etch, which can be accomplished with known state of the art etches. If desired, well implants may optionally be introduced at this point. These implants would be done using highly angled implants, preferably in the range of 10 to 45 degrees, with each implant rotated at approximately 90 degrees relative to each other in order to fully dope the sidewalls of the diffusion. In order to avoid doping the surface layer of the diffusions more heavily than the sides, the implantation could be done before removing the pad films 118, 120 and 122 in the exposed areas of PC resist 126. FIG. 9 cut C—C shows a representational perspective of silicon line 108 without pad film 120 thereon, as shown in FIG. 3A.

Figure 3B:
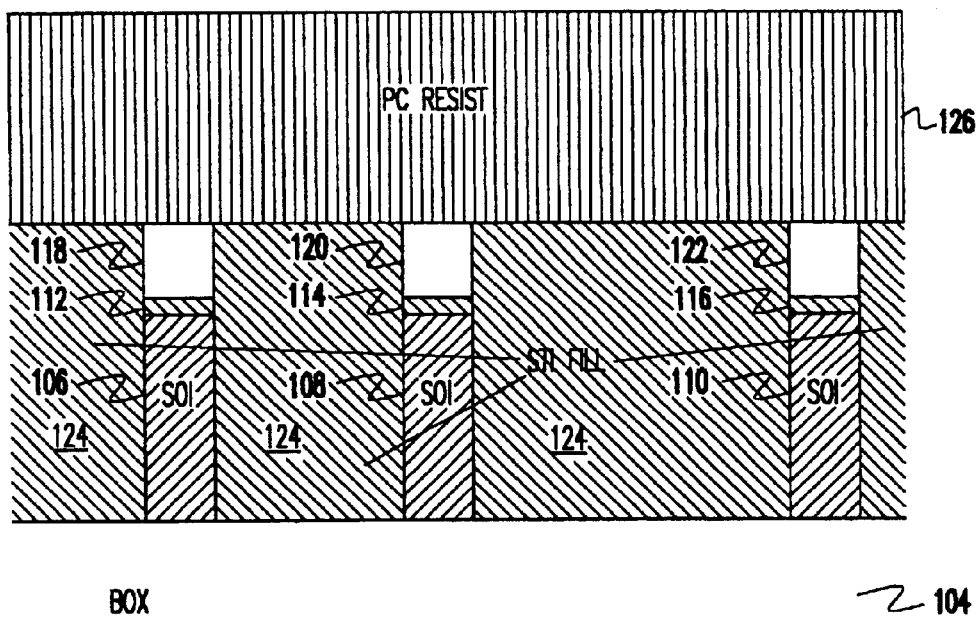
FIG. 3B is a representational cross section of cut B—B shown in FIG. 6B, after a PC resist mask is applied.

FIG. 3B is a representational cross-sectional view along line B—B shown in FIG. 6B. FIG. 3B is representational because PC resist mask 126 and STI fill 124 are present during fabrication in FIG. 3B, but are not shown in the region between the source/drain 134 and gate 128 in FIG. 6B. FIG. 3B thus shows the selective placement of PC mask 126 during fabrication. This can be accomplished using standard pattern lithography techniques using a PC mask preferably composed of either photoresist or a hardmask. FIG. 9 cut D—D shows a partial representational perspective of silicon line 108 shown in FIG. 3B.

FIG. 4A shows the substrate of FIG. 3A after gate dielectric growth [e.g., SiO2], and gate conductor deposition. It should be understood that nitrided oxides, nitride/oxide composites, metal oxides (e.g., Al2O3, ZrSiO4, TiO2, Ta2O5, ZrO2, etc.), perovskites (e.g., (Ba, Sr)TiO3, La2O3) and combinations of the above can also be used as the dielectric. Gate dielectric growth on each line 106, 108 and 110 could be standard furnace or single-wafer chamber oxidations in accordance with conventional methods. If desired, nitriding species (e.g., N2O, NO or N2 implantation) can be introduced prior to, during, or subsequent to oxidation. Gate dielectric deposition on each line 108, 110 can be can be accomplished, for example, through chemical vapor deposition (CVD) or other techniques known to those skilled in the art.

Figure 10:
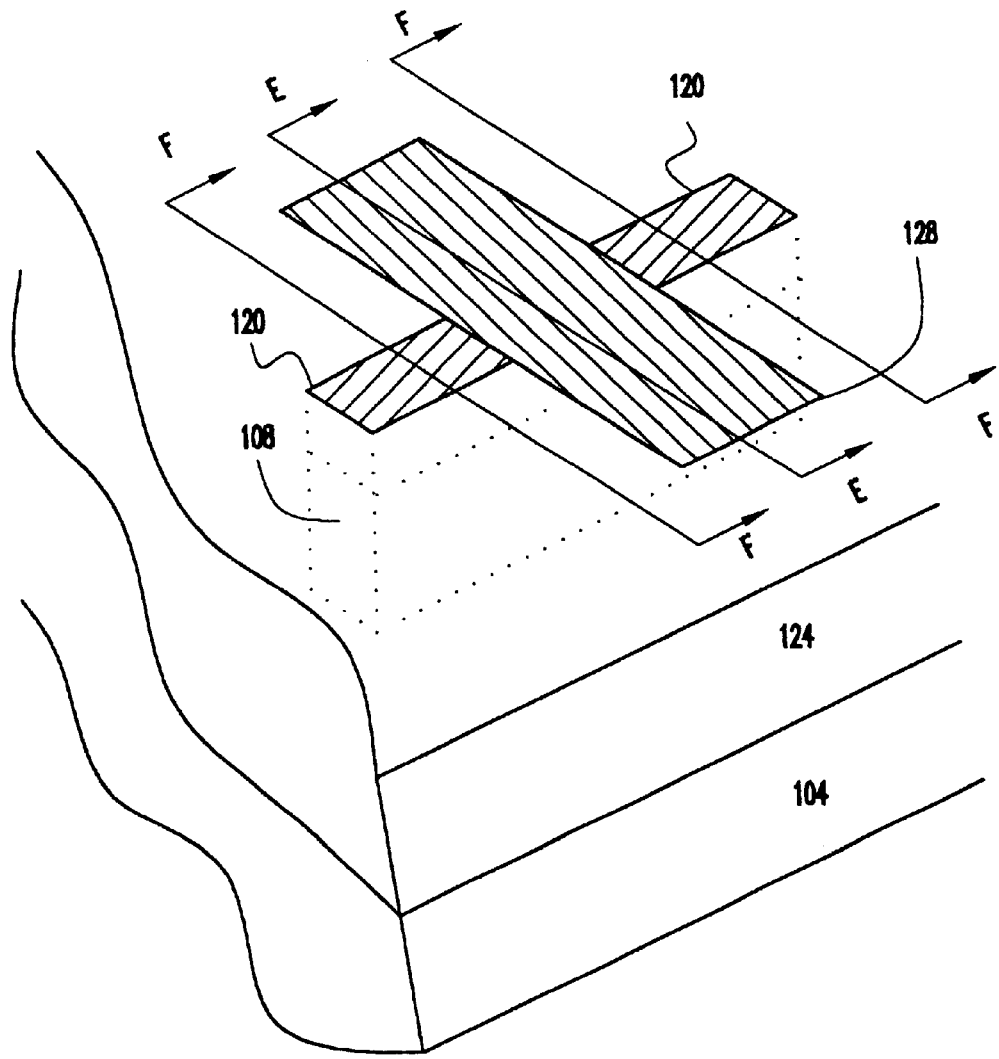
FIG. 10 cut E—E shows a partial representational cut of one of the silicon lines shown in FIG. 4A.

After etching, the gate 128 is deposited. Gate conductor deposition could be accomplished using conventional CVD or directional sputtering techniques. It should be understood that gate conductors other than polysilicon can also be used. For example, a SiGe mixture, refractory metals (e.g., W), metals (e.g., Ir, Al, Ru, Pt), and TiN can be used. In general, any material that can be polished and that has a high conductivity and reasonable workfunction can be used in place of polysilicon. After deposition, the gate 128 is polished in accordance with conventional techniques. FIG. 10 cut E—E is a representational cut of silicon line 108 and gate 128 shown in FIG. 4A.

Figure 4B:
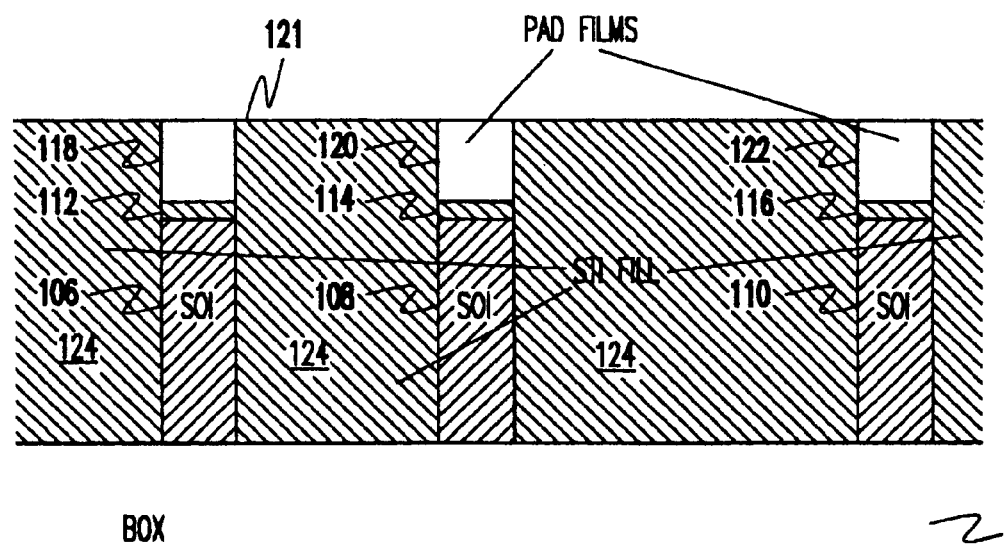
FIG. 4B shows the substrate of FIG. 3B after removal of the PC resist mask.

FIG. 4B shows FIG. 3B after removal of the PC resist mask 126. The STI surface 121 is cleaned in accordance with conventional techniques. FIG. 10 cut F—F shows a partial representational cut of silicon line 108 shown in FIG. 4B.

Figure 5B:
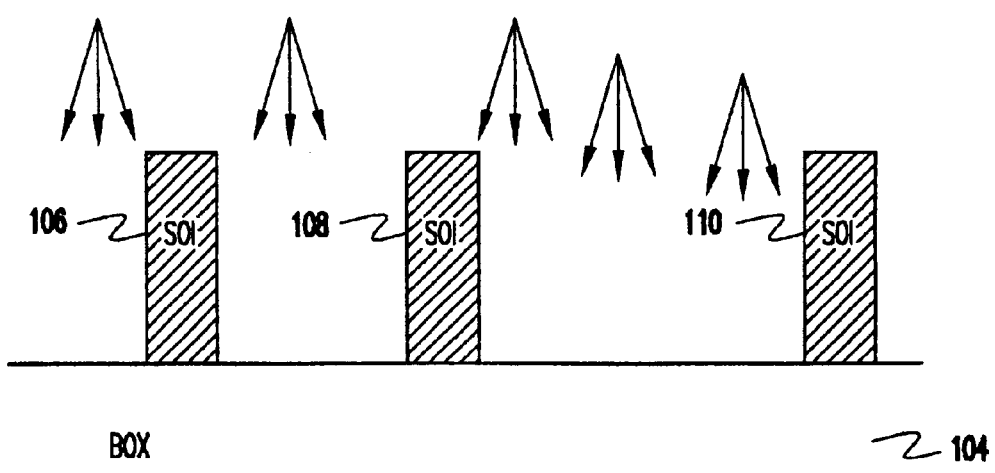
FIG. 5B shows extension implants in the substrate of FIG. 4B.
Figure 11A:
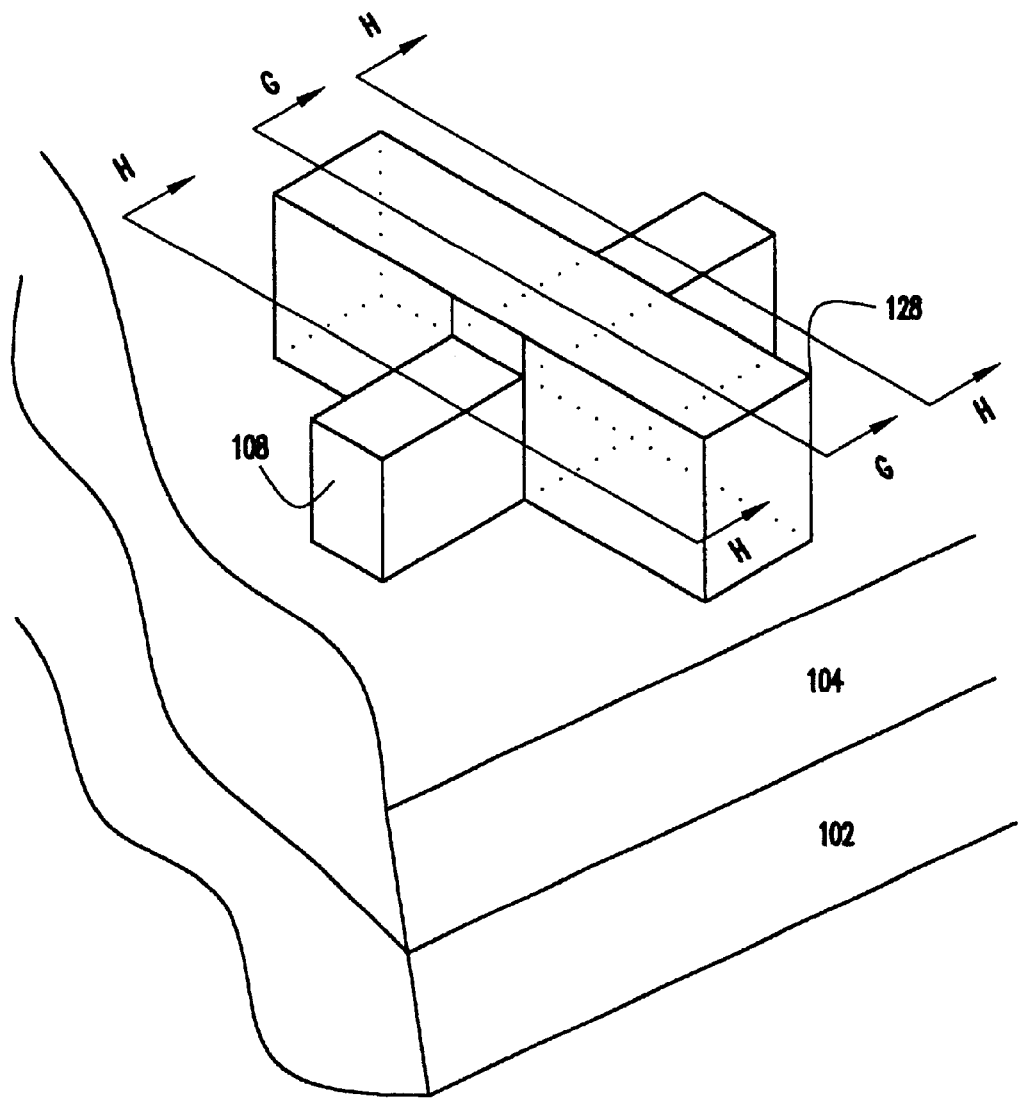
FIG. 11A cut G—G shows a partial representational perspective of one of the silicon lines shown in FIG. 5A.

FIGS. 5A and 5B show extension implants to form the MOSFET device of FIG. 4A after removal of STI fill 124. Implantations are done at a large angle, preferably in the range of 7 to 45 degrees, relative to a vector perpendicular to the wafer surface. Four implants, each rotated at approximately 90 degrees relative to each other about the wafer surface normal vector in order to fully dope the sidewalls of the diffusions uniformly. The pad oxide layer 112, 114 and 116 on top of the diffusions may be utilized to avoid doping the surface of the diffusions too strongly. In this case, the pad films 118, 120 and 122 would be removed after the implantation, but before the final implantations are done, which would follow the spacer 146 deposition. FIG. 11A cut G—G shows a perspective view of silicon line 108 shown in FIG. 5A, and FIG. 11A cut H—H shows a perspective view of silicon line 108 shown in FIG. 5B.

FIG. 6A shows the device of FIG. 5A after formation of silicide layer 144 in accordance with conventional steps. Also in accordance with conventional steps, after the gate 128 is formed, spacers 146 are formed and the diffusions are annealed, and a layer of highly conformal dielectric fill 148 is deposited, and then polished to the top of the gate conductor. It is preferred that dielectric fill 148 is a nitride layer followed by a doped glass. Because of the high aspect ratios, fill properties suggest a rapid-thermal CVD or a self-sputtering deposition using a high-density plasma-enhanced CVD technique. Typically, the dielectric glass includes phosphorus and/or boron, but it can also be undoped.

Figure 11B:
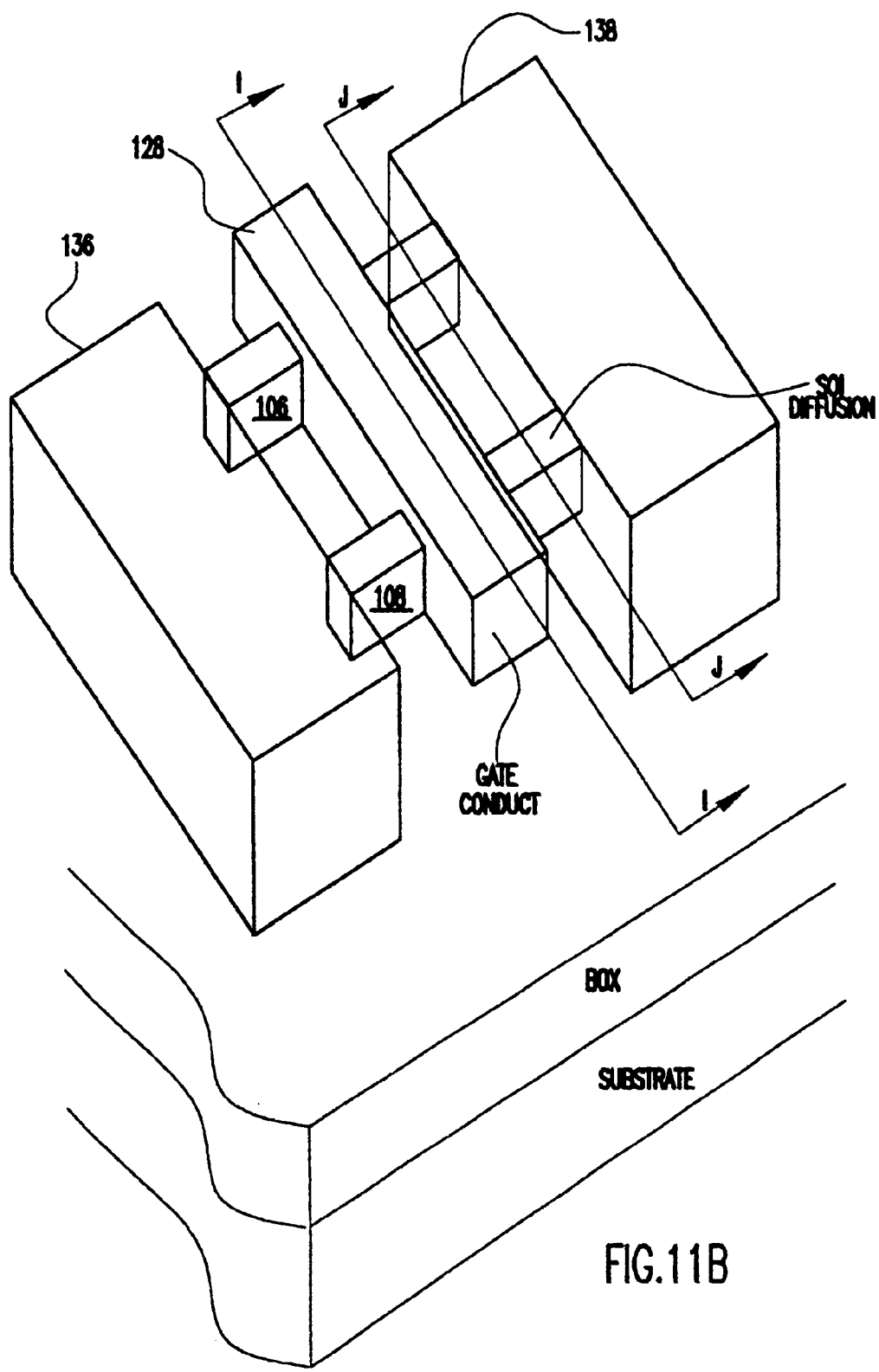
FIG. 11B cut I—I shows a representational embodiment of FIG. 6B cut A—A.

FIG. 6B shows a top view of the completed device. The source and drain region is formed by implantation. Contacts 138, 140, 142 are added and back end of line (BEOL) processing is done in accordance with conventional steps. FIG. 11B cut I—I shows a representational embodiment of FIG. 6B cut A—A, and FIG. 11B cut J—J shows a representational embodiment of FIG. 6B cut B—B. FIGS. 11A and 11B are shown as before spacers 146 and dielectric deposition as shown in FIG. 6A.

Figure 12:
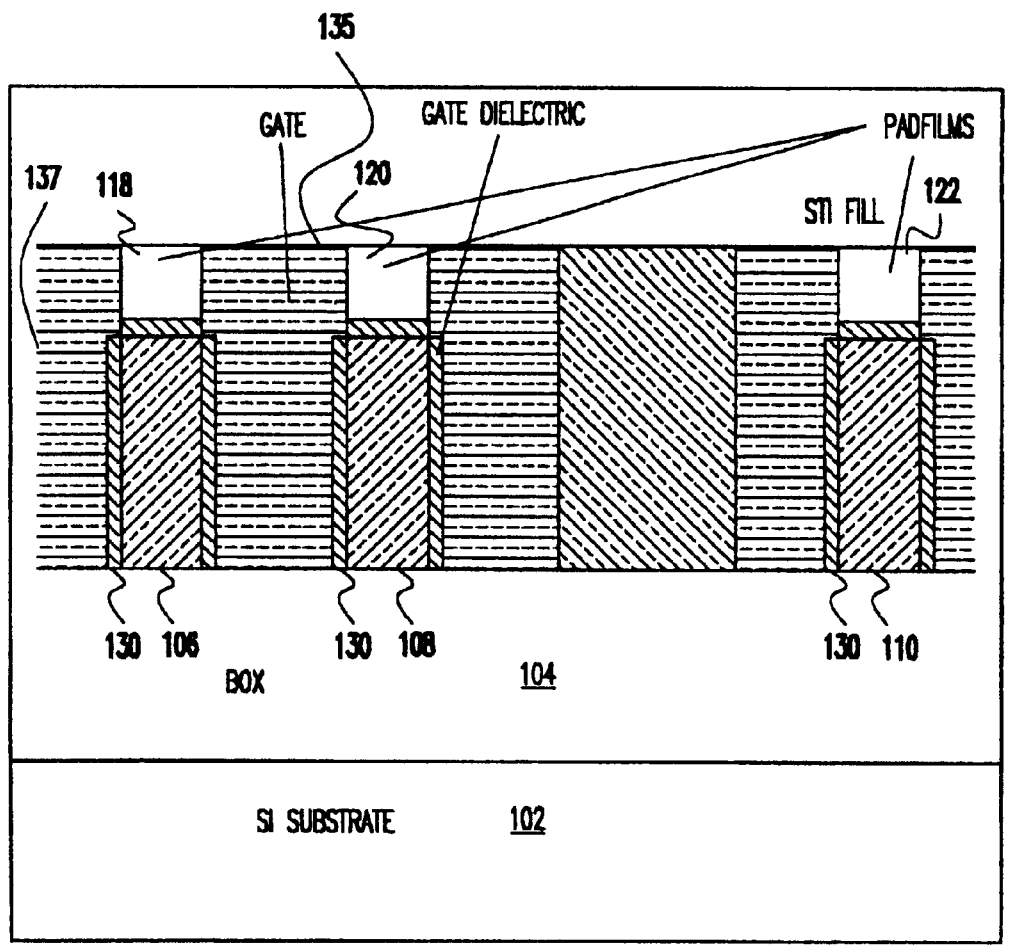
FIG. 12 is a cross-sectional view of a second embodiment that corresponds to FIG. 4A.
Figure 13A:
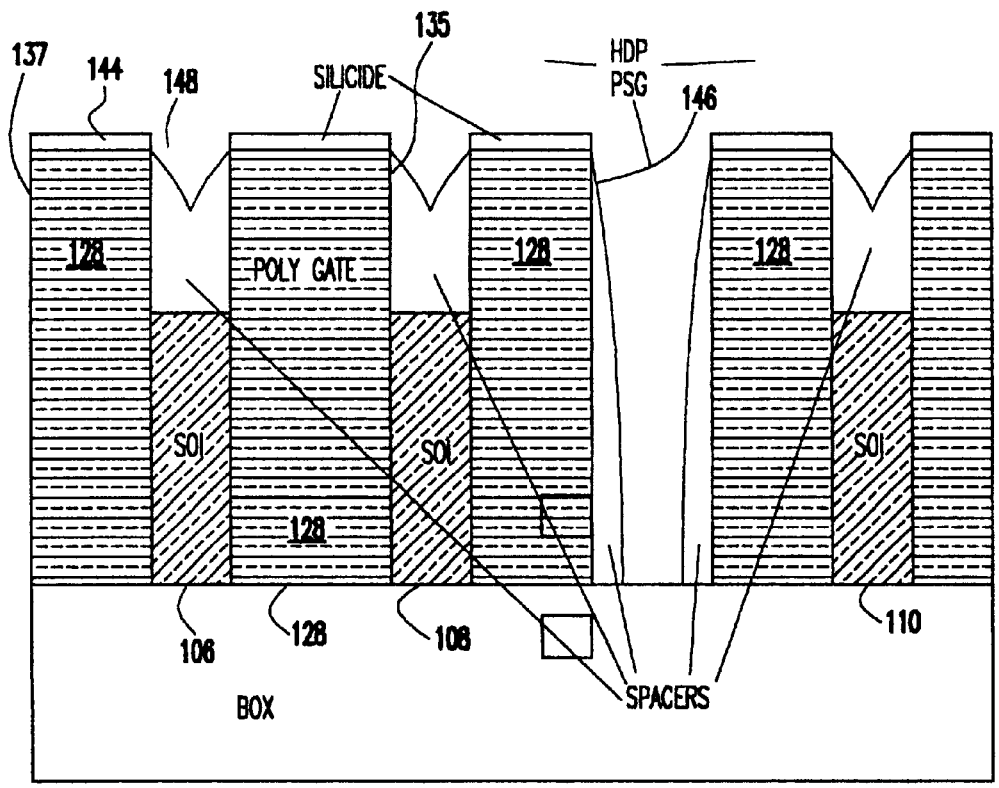
FIG. 13A is a cross-sectional view of the second embodiment that corresponds to FIG. 6A
Figure 13B:
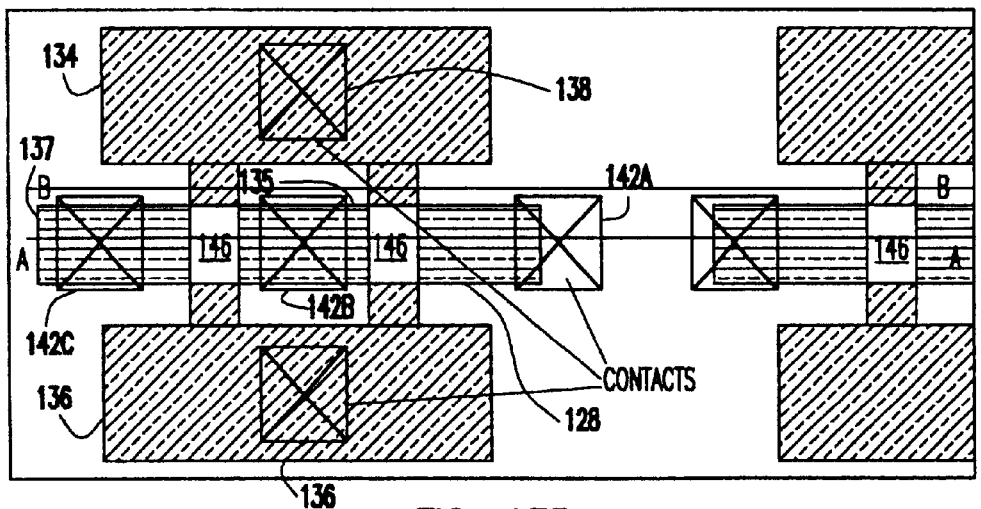
FIG. 13B is cross-sectional view of the second embodiment that corresponds to FIG. 6B.

A second embodiment is shown in FIGS. 12, 13A and 13B. In FIG. 12, a dielectric pad films 118, 120 and 122 electrically separate the gate 130 into two electrically isolated portions 135, 137. As shown in FIG. 13B, each portion 135, 137 has a planar top surface and a contact 142a, 142b, 142c on its respective planar top surface. The gate 128 is independently controlled on each side of the diffusion. However, a linear strap of metal, or a patterned layer to link the layers with a silicide can also be utilized. Note that in FIG. 13B the fingered devices become larger because etch stretch of polysilicon would have to be individually contacted unless additional masking layers are used to strap them together.

In the second embodiment, the processing steps are identical to those described up to and including FIG. 2. However, in FIG. 12, as opposed to FIG. 3A, pad films 118, 120, 122 are not etched. In this embodiment, it is preferred that the pad films be 80–150 nm.

FIG. 13A, corresponding to FIG. 6A, shows the substrate of FIG. 6A after gate conductor deposition. Gate dielectric growth, deposition and gate conductor deposition can be implemented in accordance with the conventional techniques discussed in connection with FIG. 4A. As in the case of FIG. 6A, spacers 146 are formed and the diffusions are annealed, and a layer of highly conformal dielectric fill 148 is deposited, and then polished to the top of the gate conductor.

Processing continues as in the case of the first embodiment, except that pad films 118, 120 and 122 are removed after the PC polishing step, whereas in the previous embodiment these films are removed as part of the etching process the forms the trough defining the gate regions. The pad films 118, 120 122 could alternatively be removed after the extension implantation shown in FIGS. 5A and 5B. As is the case with FIG. 6A, areas between adjacent gates 128 are filled by spacer 146 and dielectric layer 148, as shown in FIG. 13A.

Figure 14:
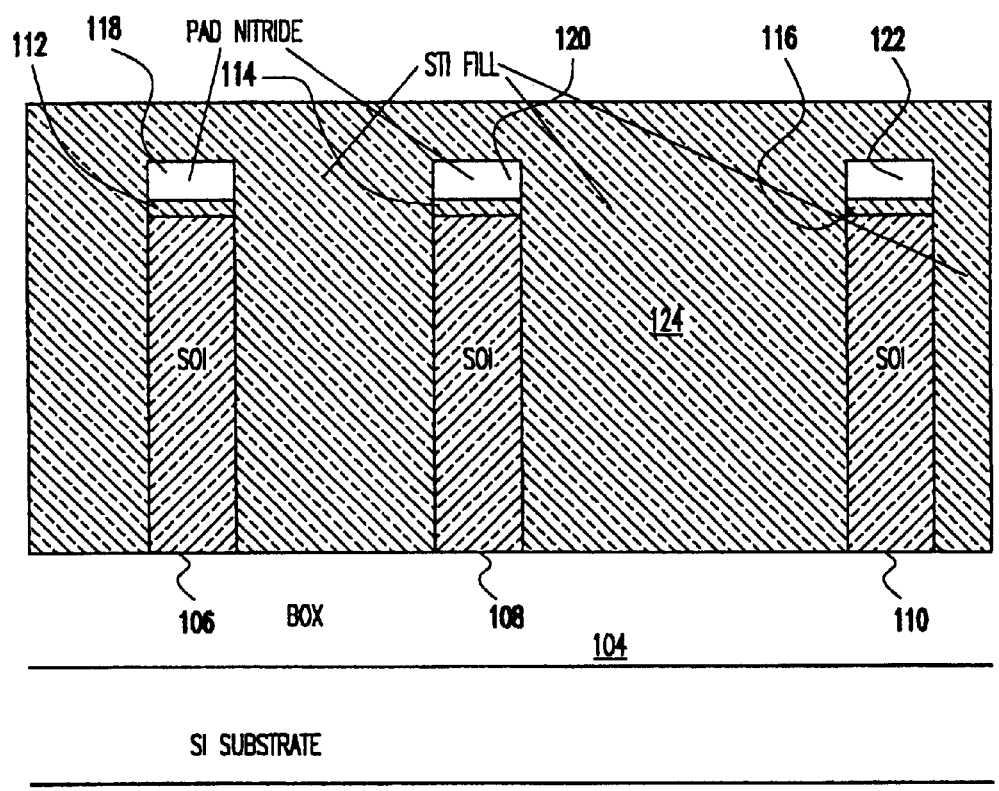
FIG. 14 is a cross-sectional view of a third embodiment that corresponds to FIG. 4B.

FIG. 14 corresponds to FIG. 4B, and shows a third embodiment. In this embodiment, polishing would not be done until etching down to pad films 118, 120 and 122. The preferred thickness of the silicon lines 106, 108 and 110 is approximately 200 nm. Pad oxide 112, 114 and 116 is grown to a thickness of approximately 5 nm, and the deposited pad nitride is approximately 30 nm.

STI fill 124 is then provided. It is preferred that STI fill 124 is approximately 570 nm, which is approximately 2.5 times the surface topography of the combined thicknesses of the pad oxide, the deposited pad nitride and the silicon lines.

Figure 15:
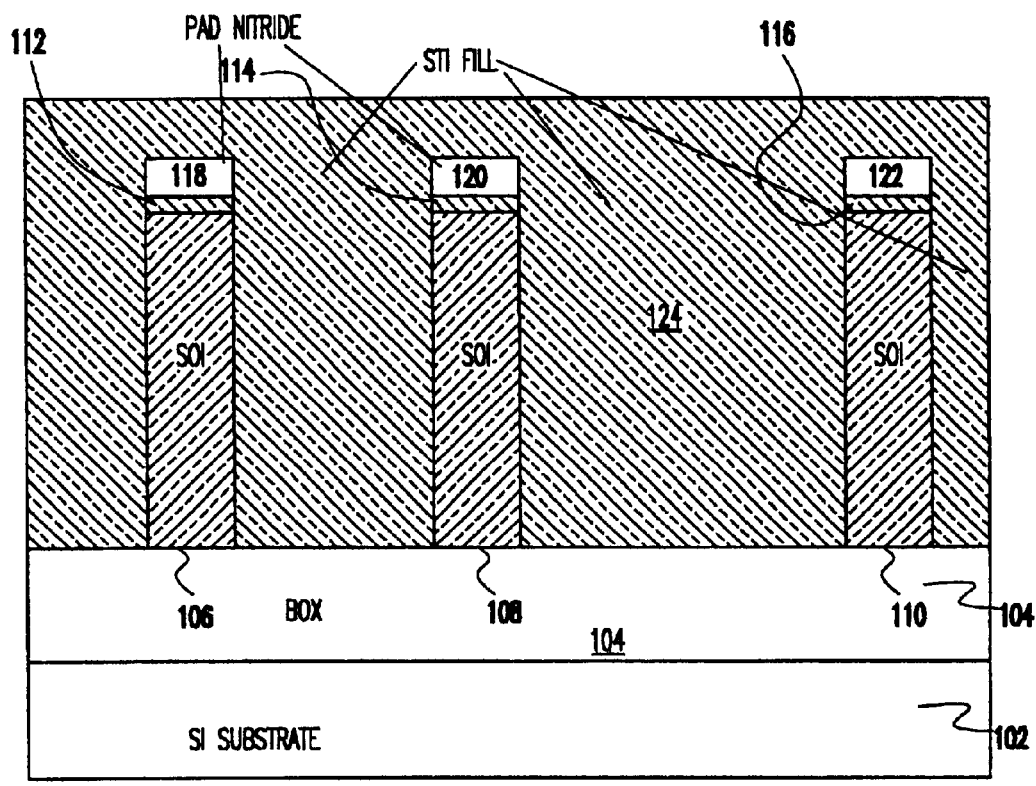
FIG. 15 shows a third embodiment of the substrate of FIG. 1 after shallow trench isolation (STI) fill and polish.
Figure 16:
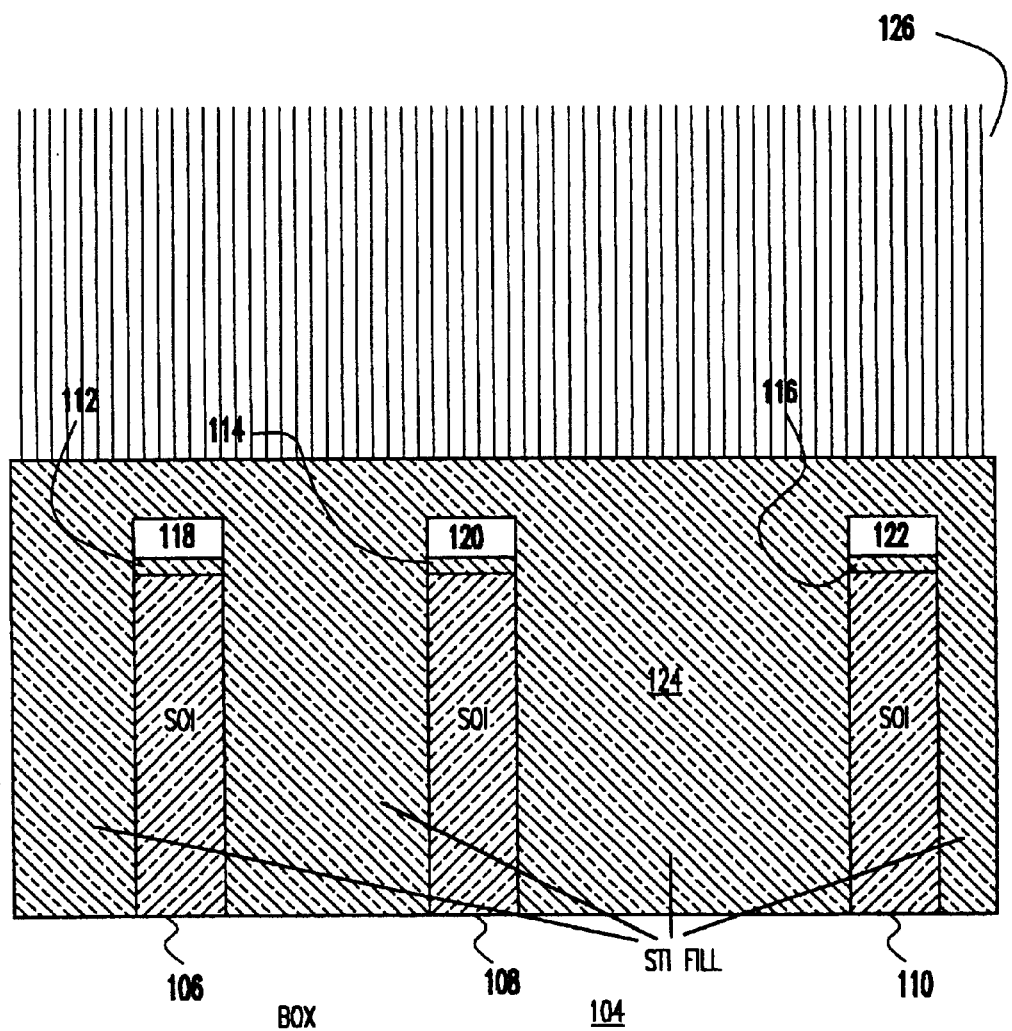
FIG. 16 is a representational cross section of cut B—B shown in FIG. 6B, after a PC resist mask is applied.

As shown in FIG. 15, the STI 124 is polished back to approximately 200 nm above the pads 118, 120 and 122. The PC resist 126 is applied, and the STI 124 is then etched to the nitride pads 118, 120 and 122 and the BOX 104. Nitride pads 118, 120 and 122 are then etched to the pad oxide 112, 114 and 116, which is a short etch since the nitride pads 118, 120 and 122 are thin. These steps result in FIGS. 3A and 16.

The pad oxide 112, 114 and 116 is then removed, preferably with a wet etch. Since the required pad oxide is thin due the thinner nitride used, undercut is minimal. Vapor HF/NH3 can also be used to further minimize undercut and control line width better. Standard well implants can be done at this point or, alternatively, before the thin pad oxide 112, 114, and 116 is grown. Note that when the pad oxide layer 112, 114, 116 is removed in the case where the STI layer 124 is also oxide, the gate 128 linewidth will increase due to lateral etching during the pad oxide removal. In FIG. 9, for example, as the pad oxide 112, 114, 116 is removed, the gate region (cut C—C) will increase in width. The total width will be the original cut plus twice the pad oxide removal. It is preferred that the thinnest gate length (width of cut C—C), so any increase is undesirable.

Figure 17A:
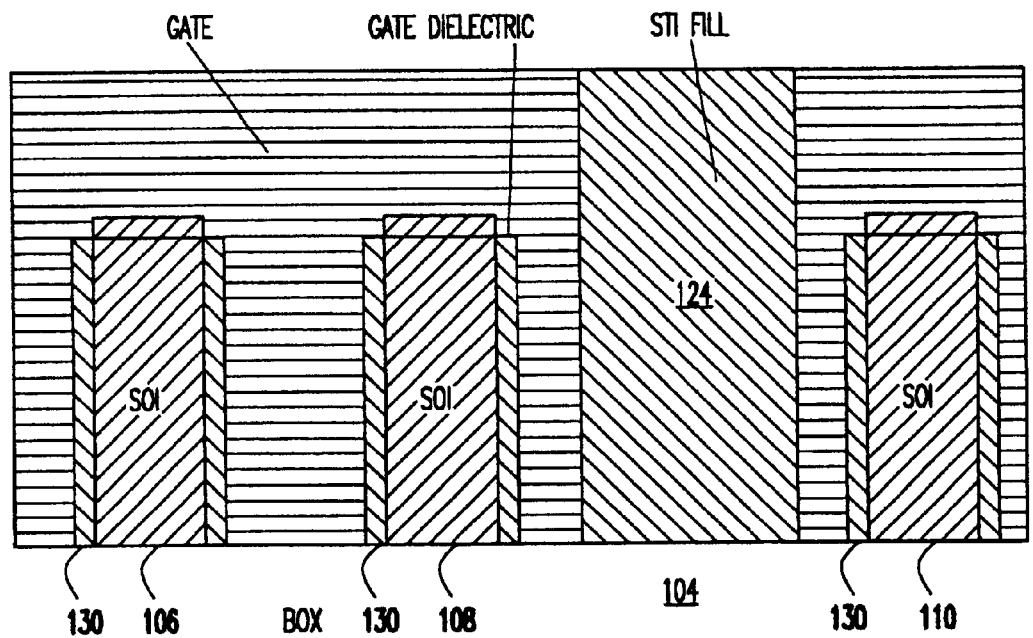
FIG. 17A shows the substrate after gate dielectric growth or deposition, and gate conductor deposition.
Figure 17B:
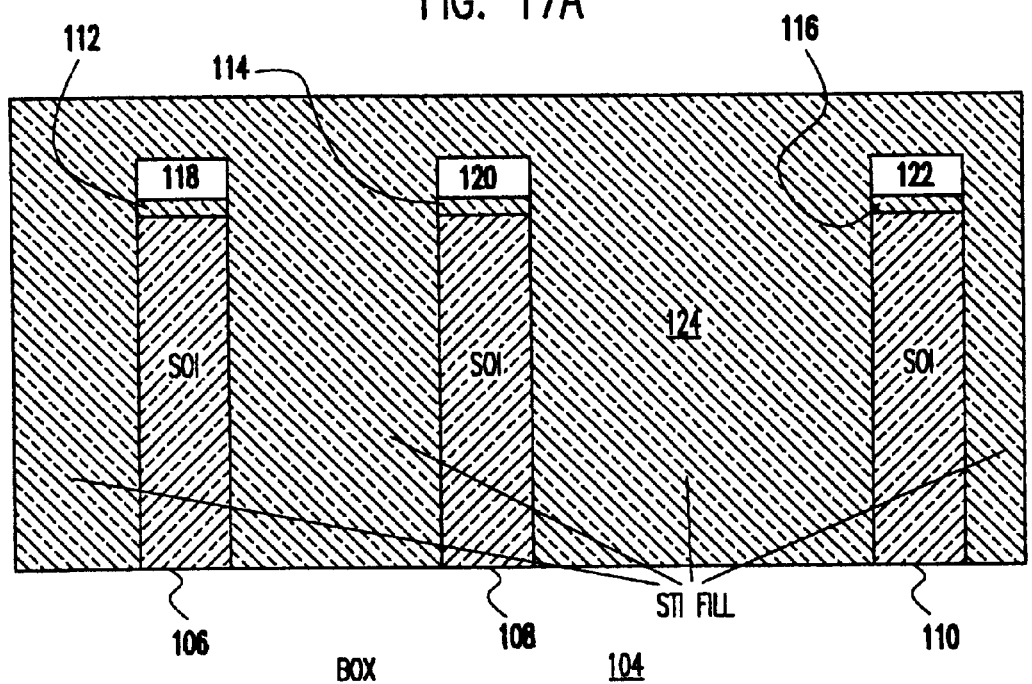
FIG. 17B shows FIG. 16 after removal of the PC resist mask.

Gate oxide 130 is grown, and gate 128 is deposited and polished back to the STI fill 124, as shown in FIGS. 17A and 17B. Finally, processing continues as shown in FIGS. 5 and 6, and described above to form extension, source and drain implants, spacers and contacts. The pad oxide 118, 120, 122 is dry etched to remove the oxide above the active area to nitride 112, 114, 115, respectively. The nitride 112, 114, 116 is wet etched to remove residual nitride. Finally, extension, and source and drain implants are followed by regular processing for MEOL.

With this fabrication method, there is less damage to active area since the nitride 112, 114, 116 is thinner, which means less reactive ion etching of the nitride. Also, oxide etching has a nitride stop layer. Finally, the pad oxide 112, 114, 116 can be thin due to the thinner nitride 118, 120, 122 which means there will be less undercut when removing the pad oxide 112, 114, 116, which will produce bad polysilicon profile. Also polysilicon line width control will also be improved.

A fourth embodiment planarizes the gate conductor film before etching rather than polishing it after a trough is formed in a different material. Silicon line formation 106, 108, 110 is identical to the previous three embodiments and is shown in FIG. 1.

Figure 18A:
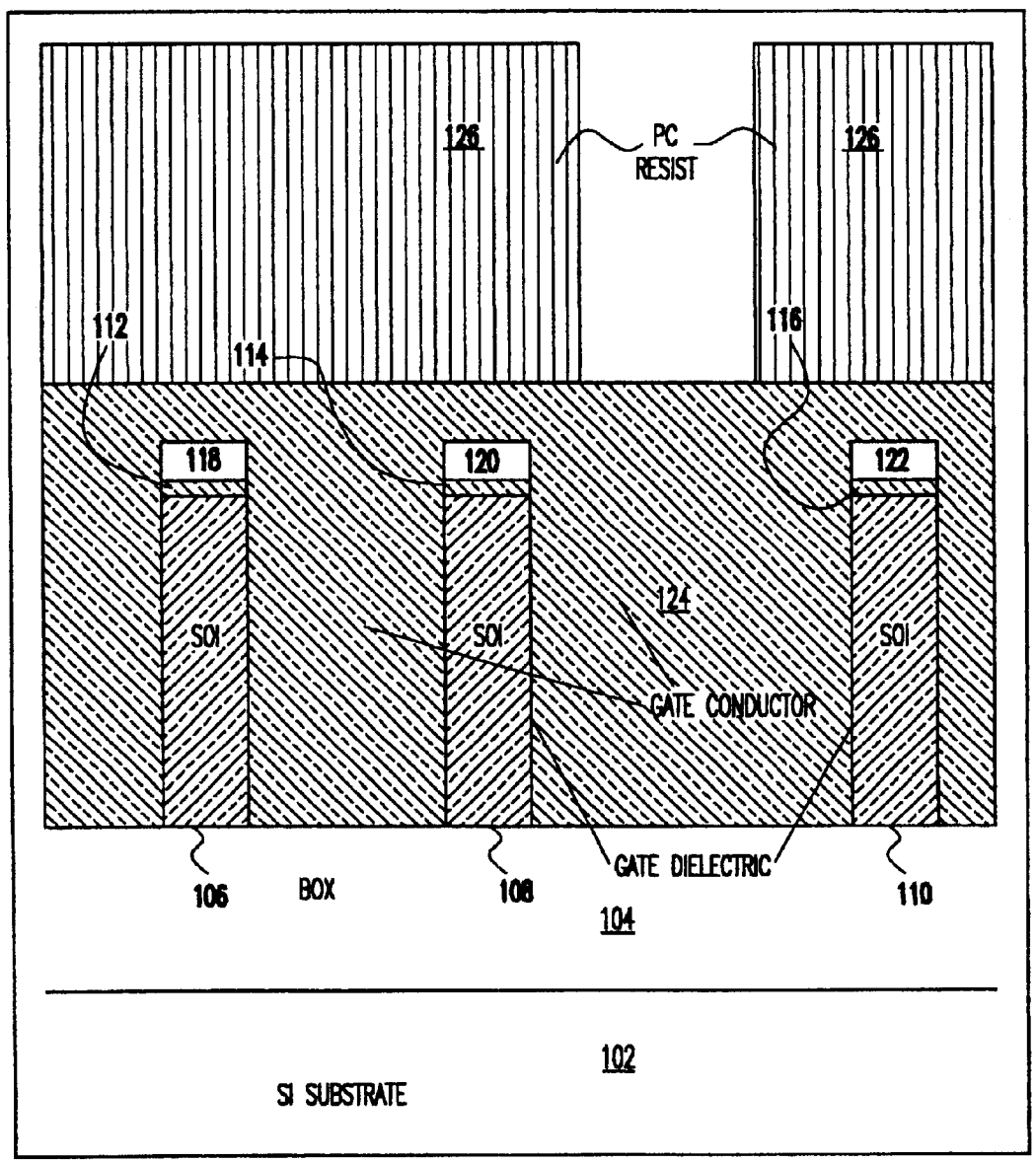
FIG. 18A shows FIG. 17B after PC resist mask is applied.
Figure 18B:
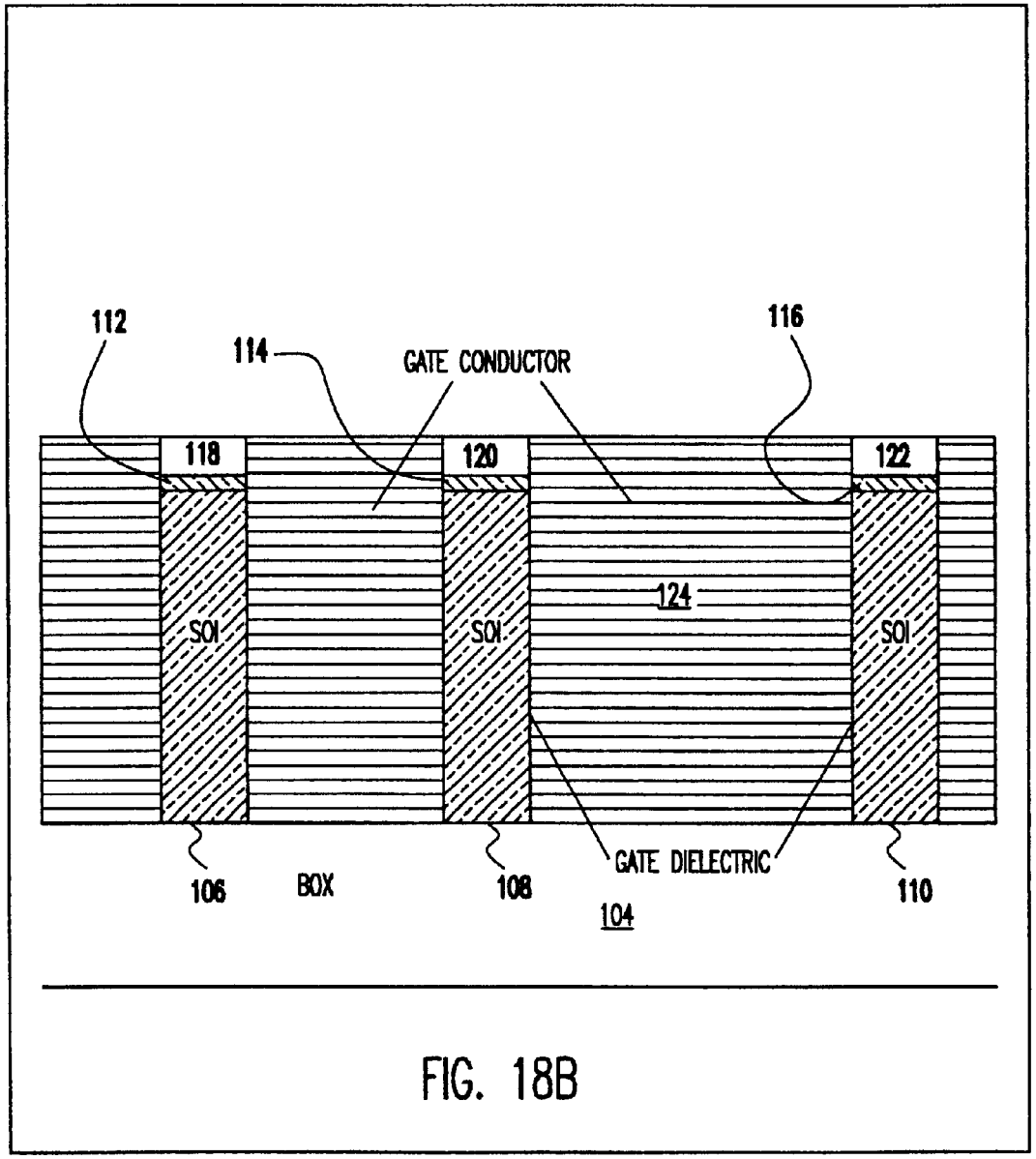
FIG. 18B shows FIG. 17B after polishing.

After the silicon lines 106, 108, 110 are formed, sacrificial oxidations may be performed to improve the surface quality of the silicon sidewall. Then the gate dielectric 130 is grown or deposited, and the gate 128 is deposited. In this case, the gate 128 material is required to be a film that can be etched selectively to the pad films 118, 120, 122, the BOX 104, and the gate dielectric film 130. Polysilicon is one example, and other suitable materials can also be used. This gate 128 material is deposited to a thickness sufficient to completely cover the regions between the silicon islands to a height well above the pad films 118, 120, 122. The gate conductor film is then polished. For the case where the gate conductors are connected together, the polish would stop above the layer of the pad films 118, 120, 122 with the height above the pad films determined by the resistive path between the gates (see FIGS. 6A and 6B). In the case where the gate conductors are independently addressed, the polish would proceed until the pad films 118, 120, 122 are reached, as shown in FIGS. 13A and 13B. The latter case is shown in FIGS. 18A and 18B after polishing the gate 124.

After defining the PC mask 126, the gate 128 is etched selectively to the gate dielectric, BOX films and the dielectric 130 on the silicon line. If the dielectric on top of the silicon line 106, 108, 110 is the gate dielectric, then stopping the etch without penetrating the gate dielectric will be quite challenging. After this etch process, the structure will be similar to that depicted in FIGS. 5A and 5B, except that in 18B the gate conductor does not extend over the silicon diffusions, and the extension implants described earlier can proceed, ultimately forming the device depicted in 13A and 13B. Obviously, if desired, the structures depicted in 6A and 6B could also be formed.

Figure 19:
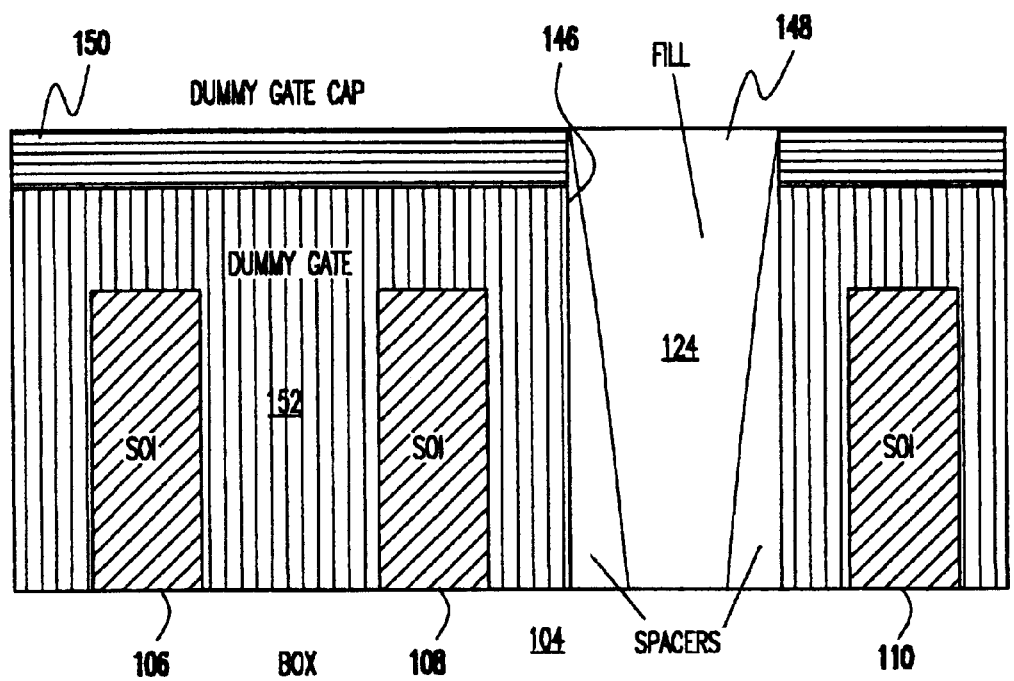
FIG. 19 shows the fabrication of a fifth embodiment.

The fifth embodiment continues from the previous embodiments, but the fourth embodiment will be used as the base. After the gate 128 is formed as above by deposition, polishing and etching, the device implants are completed, spacers 146 are formed and the diffusions are annealed, a layer of highly conformal dielectric fill 148 is deposited, and then polished to the top of the gate conductor. Note that in this case it is preferable to deposit a polish-stop layer 150 (typically a dielectric such as silicon nitride) as a cap on top of the original dummy gate conductor 152 after it has been polished but before it has been etched. Fabrication of this structure is shown in cross section in FIG. 19.

This dummy gate cap layer 150 and the dummy gate conductor 152 are then removed, a gate dielectric deposited and a second gate conductor deposited. This approach is advantageous if either the gate conductor or gate dielectric cannot withstand the high temperature steps required in forming the diffusions. This approach allows these films to be optimized independent of their stability under high temperature treatment. After the final gate is formed, a dielectric film is deposited, contacts are etched and filled with a conductive layer. After these steps are completed, the structure will approximate FIGS. 13A and B or FIGS. 6A and B.

While the invention has been described in terms of its preferred embodiments, those skilled in the art will recognize that the invention can be practiced with modification within the spirit and scope of the appended claims.

What is claimed is:

1. A method for forming a double gated FET, comprising the steps of:
    forming on a substrate a first and a second line that comprises a channel region;
    etching areas within a semiconductor layer to form a source and a drain, wherein a side surface of the source and the drain contact opposing end surfaces of the first and second lines; and
    forming a gate disposed on a top surface and two side surfaces of the first and second lines and a top surface of the substrate; and
    wherein the second forming step comprises the steps of:
    filling areas surrounding the first and second lines and between the source and the drain with an oxide fill;
    etching a portion of the oxide fill to form an area that defines a gate, wherein the area that defines the gate is disposed between the source and the drain; and
    depositing a material to form a gate.

2. The method as recited in claim 1, further comprising the steps of:
    etching the oxide fill between the gate and the source to expose the first and second lines; and
    etching the oxide fill between the gate and the drain to expose the first and second lines.

3. The method as recited in claim 2, further comprising the step of forming an oxide on the first and second lines.

4. The method as recited in claim 3, wherein the oxide is silicon dioxide.

5. The method as recited in claim 2, further comprising the steps of:
- implanting a portion of the lines between the gate and the source; and
- implanting a portion of the lines between the gate and the drain.

6. The method as recited in claim 4, wherein the implanting step is in the range of 10 to 45 degrees relative to a vector perpendicular to a top surface of the channel.

7. The method as recited in claim 5, wherein the implants are done in a series at approximately 90 degrees relative to each other.

8. The method as recited in claim 1, further comprising the step of forming a contact on each of the gate, the source and the drain.

9. The method as recited in claim 1, wherein the gate material is polysilicon.

* * * * *